(12) United States Patent
Yeoh et al.

(10) Patent No.: US 9,022,607 B2
(45) Date of Patent: May 5, 2015

(54) LEADFRAME-BASED SURFACE MOUNT TECHNOLOGY SEGMENTED DISPLAY DESIGN AND METHOD OF MANUFACTURE

(71) Applicant: Avago Technologies General IP (Singapore) Pte. Ltd., Yishun (SG)

(72) Inventors: Hock Eu Raymond Yeoh, Penang (MY); Yi Feng Hwang, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 253 days.

(21) Appl. No.: 13/655,203

(22) Filed: Oct. 18, 2012

(65) Prior Publication Data

US 2014/0111992 A1 Apr. 24, 2014

(51) Int. Cl.
*F21V 33/00* (2006.01)

(52) U.S. Cl.
CPC ..................................... *F21V 33/00* (2013.01)

(58) Field of Classification Search
USPC ........................................ 362/249.02, 311.02
See application file for complete search history.

(56) References Cited

U.S. PATENT DOCUMENTS

| | | | |
|---|---|---|---|
| 4,274,217 A * | 6/1981 | Ohshima | 40/451 |
| 7,344,902 B2 | 3/2008 | Basin et al. | |
| 7,703,971 B2 * | 4/2010 | Osawa | 362/612 |
| 7,980,728 B2 | 7/2011 | Ramer et al. | |
| 8,115,217 B2 | 2/2012 | Duong et al. | |
| 8,262,257 B2 * | 9/2012 | Deeben et al. | 362/249.02 |
| 2003/0027372 A1 * | 2/2003 | Tsuji | 438/106 |
| 2005/0179376 A1 * | 8/2005 | Fung et al. | 313/512 |
| 2009/0230409 A1 | 9/2009 | Basin et al. | |
| 2011/0075107 A1 | 3/2011 | Teijido et al. | |
| 2012/0235187 A1 * | 9/2012 | Ng et al. | 257/98 |

* cited by examiner

*Primary Examiner* — Laura Tso

(57) ABSTRACT

A multi-segment display is disclosed. The multi-segment display includes substantially no hotspots and is substantially free of color discoloration that accompanies hotspots. The multi-segment display is configured for surface mounting. The multi-segment display is provided with a leadframe that fits into a package body thereby placing the light sources mounted on the leadframe in closer proximity to the encapsulant that fills vias of each segment.

20 Claims, 8 Drawing Sheets

LEADFRAME-BASED SURFACE MOUNT TECHNOLOGY SEGMENTED DISPLAY DESIGN AND METHOD OF MANUFACTURE

FIELD OF THE DISCLOSURE

The present disclosure is generally directed toward light emitting devices and package configurations for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

One particular type of device that employs LEDs is a segmented display, such as a seven-segment display device. The current design available for Surface Mount Technology (SMT) segmented displays uses a Printed Circuit Board (PCB) as the substrate for LED attachment and electrical connections. The light source in these designs can either be an LED package or a bare LED chip in each segment of the display. The usage of pre-tested and binned LED packages in the assembly of segmented displays enables uniform display between segments in displays and also enables stacking of multiple displays.

One unfortunate drawback to current segmented display designs is that there is an air gap between the thin layer of diffused epoxy on the top portion of the display and the LED package itself. This air gap between the upper epoxy layer and LED package reduces diffusion, which, in turn, creates hotspots during light up. Hotspots in each segment produce uneven colors at the edges of the segment during light up. The physical phenomenon that causes the hotspots is due to the epoxy meniscus, which is a natural result of the air gap between the LED package and the epoxy.

SUMMARY

It is, therefore, one aspect of the present disclosure to provide a segmented display that eliminates hotspots and discoloration within the segments, especially during light up. It is another aspect of the present disclosure to eliminate hotspots and discoloration without negatively affecting intensity performance.

Embodiments of the present disclosure provide the ability to create an even dispersion of light inside each of the segments. The even dispersion of light results in evenly projected brightness and uniform color light up. The brightness performance is also maintained, if not improved.

The elimination of hotspots and discoloration, in some embodiments, is achieved by creating sufficient diffusion properties for light dispersion. Specifically, the meniscus of the epoxy is removed to promote even color distribution. In accordance with at least some embodiments of the present disclosure, a leadframe is used as the substrate for the segmented display rather than the typical PCB.

In some embodiments, a leadframe-based SMT segmented display is provided. The leadframe used to support the electrical components of the display comprises a plurality of leads that extend outside of the segmented display's package body. The leads can have one or more bends to facilitate SMT mounting of the segmented display to either a top or bottom surface of a PCB or the like. In some embodiments, the leadframe can be inserted into a cavity of the package body such that the upper surface of the leadframe is substantially adjacent to or in contact with an epoxy that fills the cavities of each segment. By placing the electrical components, and specifically the light source(s), within close or immediate proximity of the encapsulant/epoxy, the occurrence of hotspots and discoloration is eliminated for the segmented display.

In some embodiments, a single encapsulant/epoxy is used to fill the segment cavities as well as the main cavity that receives the leadframe. The single encapsulant/epoxy may be filled to substantially the same plane as the lower surface of the package body and the leads of the leadframe can then be bent as desired.

In some embodiments, a leadframe may be substantially planar and may have a light source mounted thereto. In some embodiments, the leadframe may be provided with a socket that is configured to receive the light source. In either configuration (e.g., with or without the leadframe socket), a phosphor or the like can be provided around the light source. The utilization of the leadframe socket, in some embodiments, may enable a more consistent phosphor deposition around the light source.

The present disclosure will be further understood from the drawings and the following detailed description. Although this description sets forth specific details, it is understood that certain embodiments of the invention may be practiced without these specific details. It is also understood that in some instances, well-known circuits, components and techniques have not been shown in detail in order to avoid obscuring the understanding of the invention.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, although particular types of displays are depicted and described herein, embodiments of the present disclosure are not so limited. Specifically, embodiments of the present disclosure can be utilized in any type of display and are not necessarily limited to seven segment displays or LED-based displays. Rather, displays having one, two, three, four, five, six, eight, nine, . . . , twenty, etc. segments may incorporate elements of the display discussed herein. Also, any type of display, whether utilizing an LED light source or not, may utilize elements of the display discussed herein.

Figures 1A, 1B:
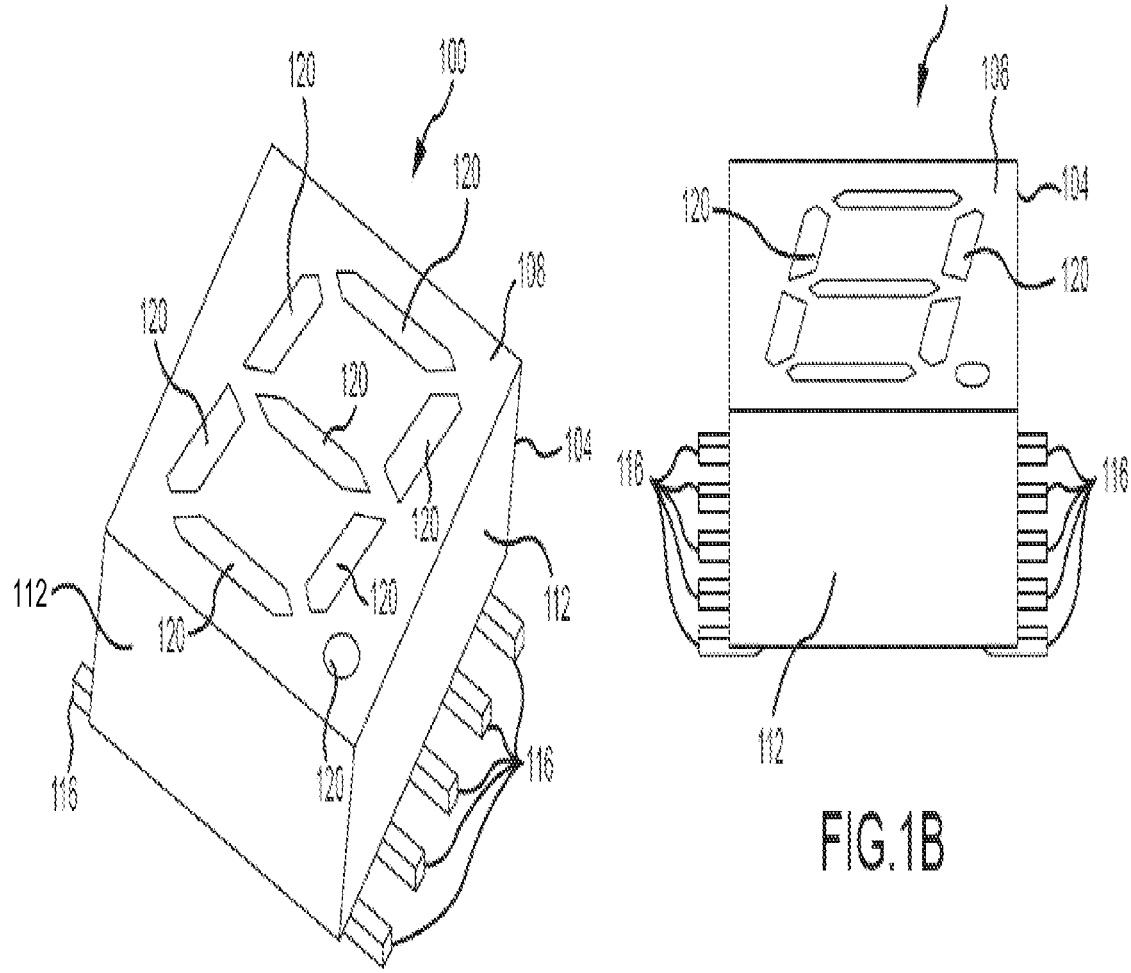
FIG. 1A is a first top isometric view of a segmented display in accordance with embodiments of the present disclosure.
FIG. 1B is a second top isometric view of a segmented display in accordance with embodiments of the present disclosure.

Referring initially to FIGS. 1A and 1B, details of a segmented display 100 will be described in accordance with embodiments of the present disclosure. The segmented display 100 may comprise a package body 104 having a top surface 108 and a plurality of side surfaces 112.

In some embodiments, the package body 104 is constructed of a non-conductive material such as plastic, glass, ceramic, etc. In some embodiments, the package body 104 is substantially rigid and is capable of holding its form without assistance from other materials or components. Suitable materials that may be used for the package body 104 include, without limitation, plastic (e.g., PET, PTFE, PVC, etc.), ceramic, glass, metal, alloys, or combinations thereof.

The top surface 108 may correspond to a display surface and, in some embodiments, may comprise a plurality of display segments 120. Each display segment 120 may have a corresponding light source associated therewith that, when activated or lit, illuminates the corresponding segment 120. As can be seen in FIGS. 1A and 1B, one example of a segmented display 100 comprises seven segments 120 to enable the dynamic creation or display of digits 0 thru 9 and/or certain letters. The segmented display 100 may also comprise a segment 120 for a decimal value or the like. Other configurations of multi-segmented displays may also be employed without departing from the scope of the present disclosure. For example, a segmented display such as a starburst or the like, may be utilized to display all letters in the English language. Of course, a segmented display 100 having other types of segment orientations may be used to depict characters or letters of non-English languages.

The depicted segmented display 100 also comprises a leadframe having a plurality of leads 116 protruding from the package body 104. Each of the leads 116 may be provided to enable control of the electronics (e.g., light sources) within each segment 120. In some embodiments, some of the leads 116 may correspond to ground leads whereas other leads may be used to control a light source within a particular segment 120, for example. The leads 116 depicted in FIGS. 1A and 1B may be configured to enable the segmented display 100 to be surface mounted to another substrate, such as a PCB.

Figure 2A:
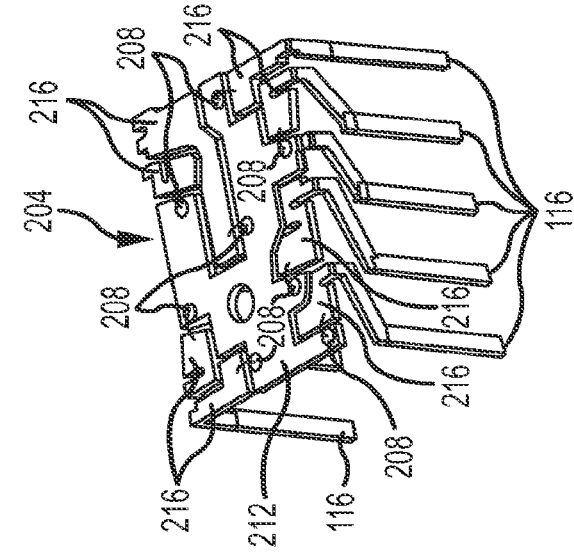
FIG. 2A is an isometric view of a leadframe in accordance with embodiments of the present disclosure.
Figure 2B:
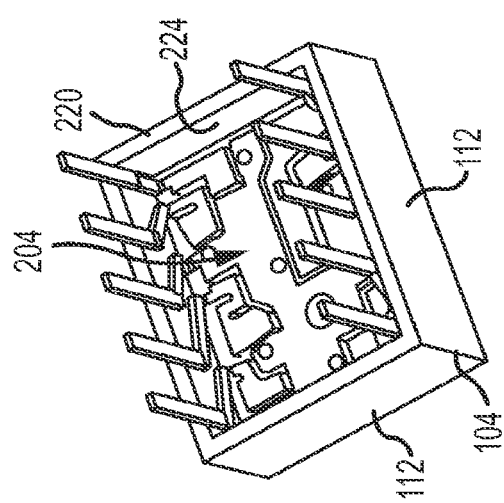
FIG. 2B is a bottom isometric view of a leadframe inserted into a package body in accordance with embodiments of the present disclosure.
Figure 2C:
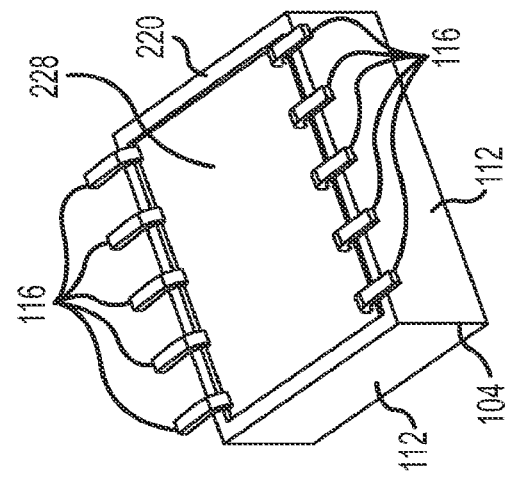
FIG. 2C is a bottom isometric view of a segmented display in accordance with embodiments of the present disclosure.

With reference now to FIGS. 2A-C, additional details of a package body 104 and leadframe 204 will be described in accordance with embodiments of the present disclosure. FIGS. 2A-C also depict a sequence of intermediate products that may ultimately result in a segmented display 100 that is configured for surface mounting. As noted above, the leadframe 204 may comprise a plurality of leads 116. Each of the plurality of leads may comprise a terminal end that extends beyond the package body 104 and enables the segmented display 100 to be surface mounted to a PCB, for instance.

In some embodiments, the leadframe 204 may initially be provided as a sheet of metal or the like. The sheet of metal may be stamped and formed to realize individual leads 116, each of which are electrically separated from one another. Some of the leads 116 may eventually be used to carry control signals to electronics 208 mounted on mounting sections of the leads 116 whereas other leads may be provided as ground and/or pure mounting leads.

In the depicted example, the leadframe 204 comprises a substantially flat or planar upper surface that facilitates mounting of electronics 208 thereto. Some of the leads 116 may be connected to a common mounting section 212 whereas other leads 116 may comprise an isolated mounting section 216. The leads 116 having an isolated mounting section 216 may be configured to carry electrical signals to electronics 208 that are mounted on the common mounting section 212. These particular leads 116 may be referred to as input leads. The other leads 116 that are connected to the common mounting section 212 may be used to provide a common voltage (e.g., ground) to the electronics 208 and, in some embodiments, may be referred to as ground leads.

In some embodiments, the leadframe 204 may comprise any type of electrically-conductive material or composition of materials. As some non-limiting examples, the leadframe 204 or components thereof may be constructed of metal, steel, alloys, conductive polymers, or the like. More specific materials that may be used to form the leadframe 204 include, without limitation, lead, Cu, Ag, Au, steel, etc.

The number of leads 116 provided for the segmented display 100 may depend upon the number of segments 120 in the display 100. In some embodiments, a display 100, such as the one depicted in FIGS. 1A and 1B may comprise ten leads 116, where two of the leads 116 are connected to the common mounting section 212 while each of the other leads 116 are connected to a different isolated upper mounting surface 216. In some embodiments, all of the electronics 208 may be physically mounted on the common mounting section 212 and the wires may be used to electrically connect the electronics 208 to the isolated upper mounting surfaces 216.

FIG. 2B shows how, in some embodiments, the leadframe 204 can be fit within the package body 104. Specifically, as discussed above, the package body 104 may comprise a plurality of side surfaces 112. In some embodiments, each of the side surfaces 112 may correspond to outer surfaces of a sidewall 220 that travels the perimeter of the package body 104. Even more specifically, the sidewall 220 may also comprise inner surfaces 224 that establish a cavity within the package body 104. In some embodiments, the leadframe 204 may be configured to be inserted or fit within the cavity established by the inner surfaces 224 of the sidewall 220. Establishment of the cavity with the sidewall 220 enables the leadframe 204 be placed within the package body 104, thereby placing the electronics 208 on the common mounting section 212 within close proximity to the top surface 108 of the package body 104.

As will be discussed in further detail herein, by placing the electronics 208 in close proximity to the top surface 108 of the package body 104, embodiments of the present disclosure enable the segmented display 100 to avoid hotspots and discoloration due to the air gap between the light source and the epoxy which fills the holes of each segment 120. As can be seen in FIG. 2C, an encapsulant 228 may be used to fill the cavity established by the sidewall 220. This encapsulant 228 may also be the same material that fills the holes or vias of the segments 120. In other words, the encapsulant 228 used to fill the cavity of the segmented display 100 and substantially fix the leadframe 204 into the package body 104 may be the same material that is used to fill the vias or holes of the segments 120.

In some embodiments, the encapsulant 228 is substantially transparent or translucent, so that it enables light from the light sources of the electronics 208 to illuminate the segments 120. The encapsulant 228, in some embodiments, serves the dual purpose of protection and light conditioning. Specifically, the encapsulant 228 may be configured to protect the electronics 208 mounted on the leadframe 204. The encapsulant 228 may also substantially fix the relative position of the leadframe 204 within the package body 104. Moreover, the encapsulant 228 may be configured to condition light (e.g., diffuse, direct, and/or disperse) generated by the light sources as it exits each segment 120. In some embodiments, the encapsulant 228 may also comprise optical properties for changing the color of light emitted by the light source before it exits the display 100. Moreover, the encapsulant 228 may act as a lens for shaping light as it exits the display 100. In some embodiments, the encapsulant 228 may be formed of an epoxy, silicone, a hybrid of silicone and epoxy, phosphor, a hybrid of phosphor and silicone, an amorphous polyamide resin or fluorocarbon, glass, plastic, or combinations thereof.

Figure 3:
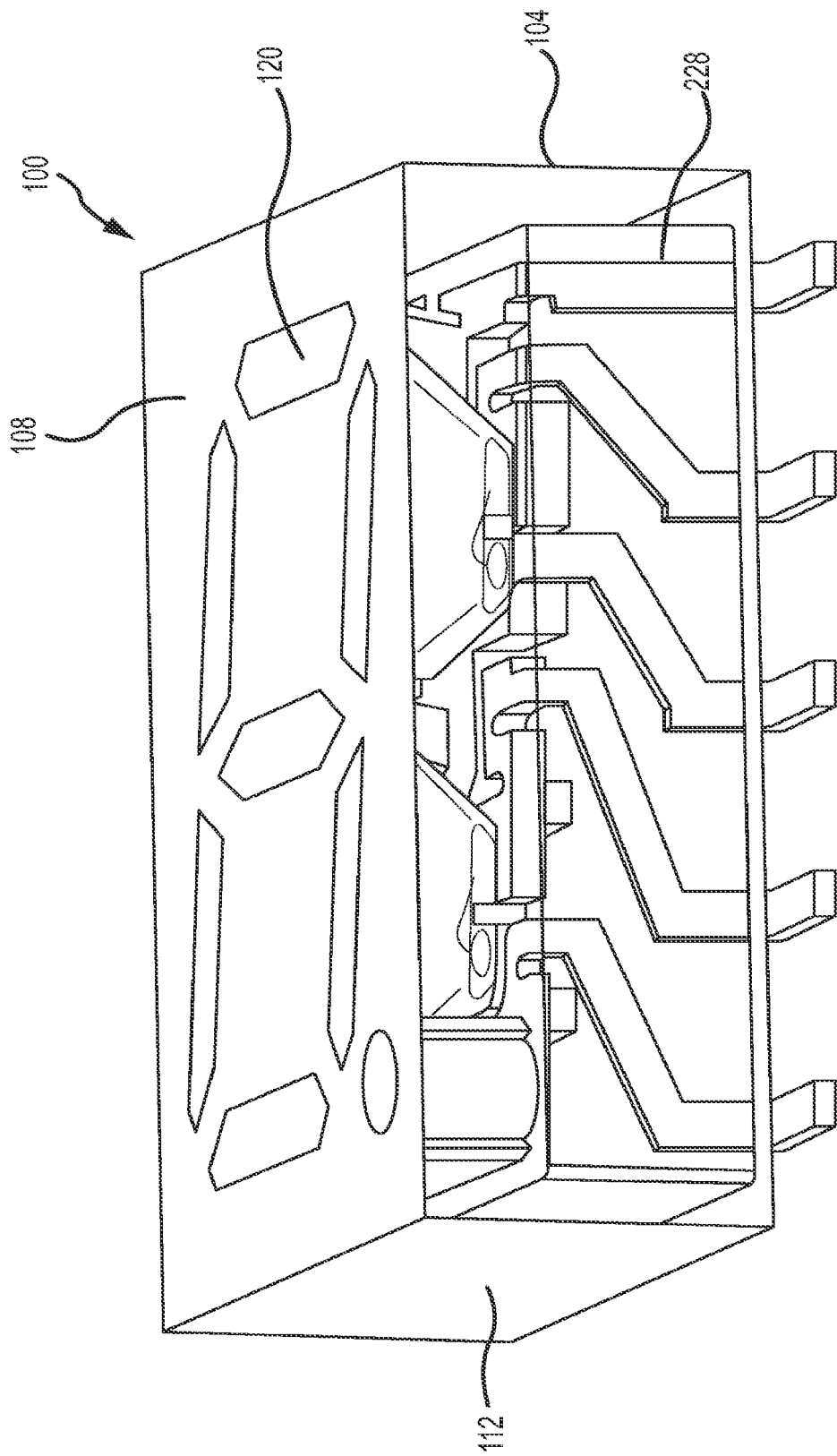
FIG. 3 is an isometric cross-sectional view of a segmented display in accordance with embodiments of the present disclosure.

FIG. 3 shows additional details of the construction of the package body 104 and the way in which the encapsulant 228 fills the cavity established by the sidewall 220. Specifically, the top surface 108 of the package body 104 may comprise an opposing inner surface. The cavities of each segment 120 may extend between the top surface 108 and the opposing inner surface that is exposed to the cavity established by the sidewall 220. In some embodiments, the encapsulant 228 fills the entirety of the cavity that is not already filled by the leadframe 204 as well as at least some portions of the holes established for each segment 120. The encapsulant 228 may abut the inner surface of the package body 104 that opposes the top surface 108.

Figure 4A:
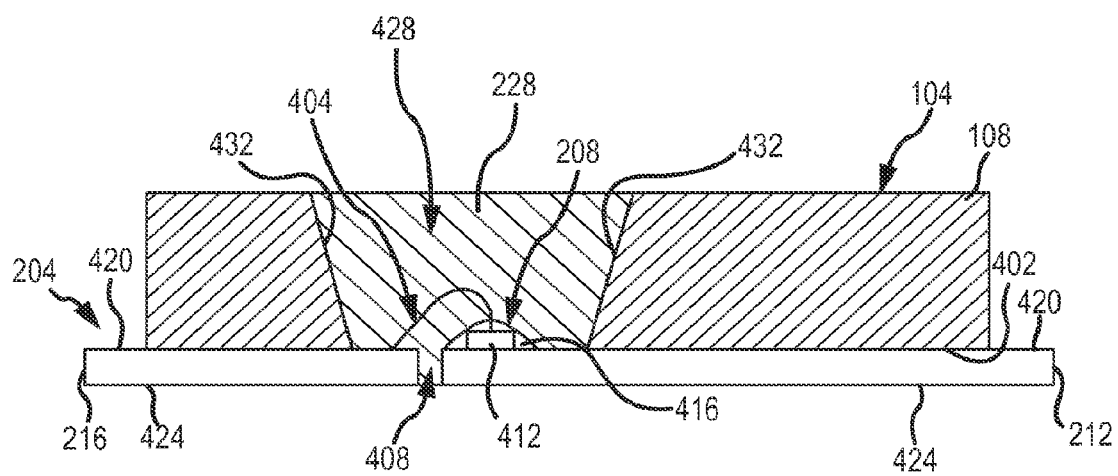
FIG. 4A is a cross-sectional view of a segmented display having a first leadframe configuration in accordance with embodiments of the present disclosure.
Figure 4B:
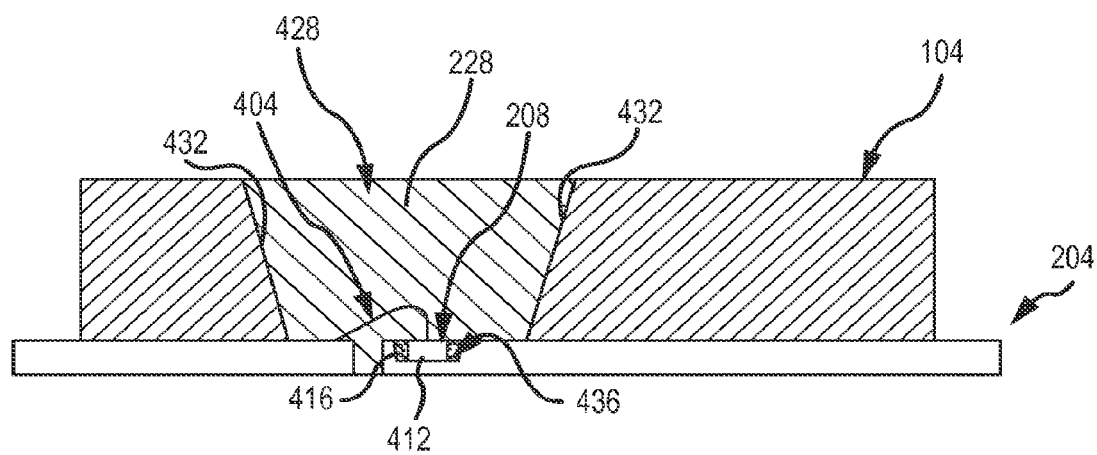
FIG. 4B is a cross-sectional view of a segmented display having a second leadframe configuration in accordance with embodiments of the present disclosure.

FIGS. 4A and 4B depict further details of a segment 120 construction in accordance with at least some embodiments of the present disclosure. In some embodiments, each segment 120 may comprise a hole or via 428 that extends from the top surface 108 of the package body 104 to the opposing inner surface 402 of the package body 104. The via 428 may be configured to receive the electronics 208, which are mounted on the leadframe 204. More specifically, the leadframe 204 may comprise a top major surface 420 that is proximate, adjacent, or in direct contact with the opposing inner surface 402 of the package body 104. The leadframe 204 may also comprise a bottom major surface 424 that faces towards the cavity of the package body 104.

The via 428, in some embodiments, provides space which accommodates the electronics 208, such as a light source 412 and wire 404. Because the top major surface 420 of the leadframe 204 is configured to be positioned adjacent to the opposing inner surface 402 of the package body 104, the via 428 provides the relief within the package body 104 for accommodating the electronics 208, which are mounted on the leadframe 204.

In some embodiments, the via 428 may be established using any known type of manufacturing technique such as punching, etching, cutting, machining, etc. Specifically, the via 228 may comprise a wall 432 that extends from the top surface 108 to the opposing inner surface 402. In some embodiments, the via wall 432 may be treated with a reflective material or finish to further enhance the light emission out of the segment 120.

As noted above, the leadframe 204 may comprise a common mounting section 212 and an isolated mounting section 216. A gap 408 may be established between the common section 212 and each of the isolated mounting sections 216 to maintain electrical isolation between the components. In some embodiments, the light source 412 is mounted on the common mounting section 212 and the wire 404 is used to cross the gap 408 and connect the light source 412 to an isolated mounting section 216. In some embodiments, the wires 404 may be made of an electrically conductive material such as Au, Ag, Cu, and the like.

The light source 412, in some embodiments, comprises a single LED, a plurality of LEDs, or a specially-configured array of LEDs. By connecting the light source 412 to two different leads 116, an electrical potential can be applied to an anode and cathode of the light source 412 thereby energizing the light source 412 and causing it to emit light. In some embodiments, the light source 412 is configured to emit light from its top surface (e.g., away from the leadframe 204). However, it should be appreciated that the light source 412 may be configured to emit light from its side surfaces or it may be configured to emit light toward the leadframe 204.

Furthermore, although the depicted examples show the light source 412 as having a single wire 404 connected thereto, it should be appreciated that both the anode and cathode of the light source 412 may be provided on the same surface of the light source and, therefore, multiple wires may be used to electrically connect the light source 412 to leads 116.

An advantage to using the leadframe 204 instead of the traditional PCB as the substrate for mounting electronics thereto is that the leadframe 204 can be inserted within the cavity of the package body 104, thereby eliminating the air gap between the light source 412 and the epoxy that fills the via 428. Furthermore, embodiments of the present disclosure enable the use of a single encapsulant 228 to fill the cavity of the package body 204 as well as the vias 428 established for each segment 120. It should be appreciated, however, that multiple different encapsulants can be used without departing from the scope of the present disclosure.

In some embodiments, some or all of the electronics 208 can be covered and/or protected with an additional encapsulant 416. In particular, a phosphor material or the like can be used as the additional encapsulant 416 to adjust the color of light emitted by the light source 412 before it exits the display 100. The additional encapsulant 416 may also provide the ability to secure and/or protect the light source 412 and at least some of the wire 404 while the leadframe 204 is being inserted into the package body 104.

One example configuration of a leadframe 204 is depicted in FIG. 4A where the light source 412 is mounted on the top major surface 420 of the leadframe 204. More specifically, the light source 412 is mounted on the same plane that is shared between the top major surface 420 of the leadframe 204 and the opposing inner surface 402 of the package body 104.

Another example configuration of a leadframe 204 is depicted in FIG. 4B where the light source 412 is mounted on the leadframe 204 within a leadframe socket 436. In particular, the common mounting section 212 may comprise an indentation, depression, or relief structure that forms a leadframe socket 436. The leadframe socket 436 can be provided as a location on the leadframe 204 where the light source 412 may be mounted. One advantage to using the configuration of FIG. 4B is that the deposition of the additional encapsulant 416 can be controlled and the amount of additional encapsulant 416 can be reduced as compared to the configuration of FIG. 4A.

Figure 5:
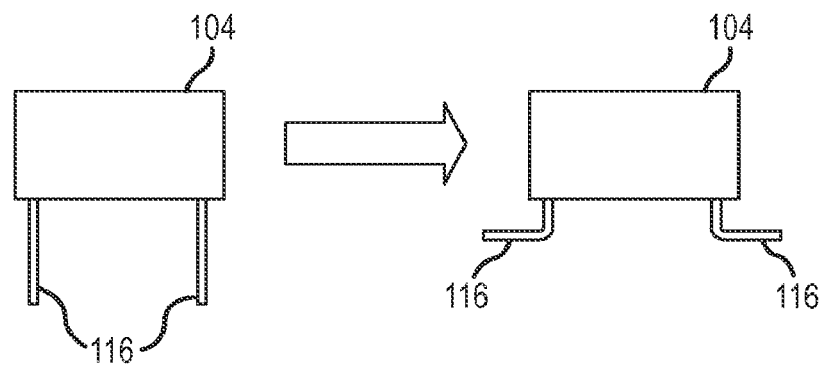
FIG. 5 depicts a first process for manufacturing a segmented display in accordance with embodiments of the present disclosure.

FIG. 5 depicts one method of manufacturing a segmented display 100 in accordance with at least some embodiments of the present disclosure. In particular, the ends of the leads 116 protruding from the package body 104 and encapsulant 228 may initially be pointing straight away from the package body 104. The leads 116 may then be bent or folded during a lead-forming step such that the leads 116 assume an L-shaped configuration. The L-shaped configuration of leads 116 may enable the segmented display 100 to be surface mounted to a PCB or the like.

Figure 6:
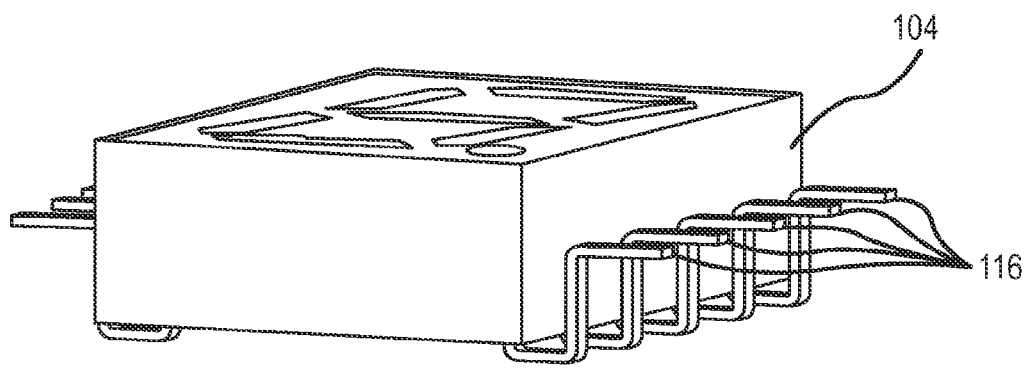
FIG. 6 is a top isometric view of a segmented display in accordance with embodiments of the present disclosure.
Figure 7:
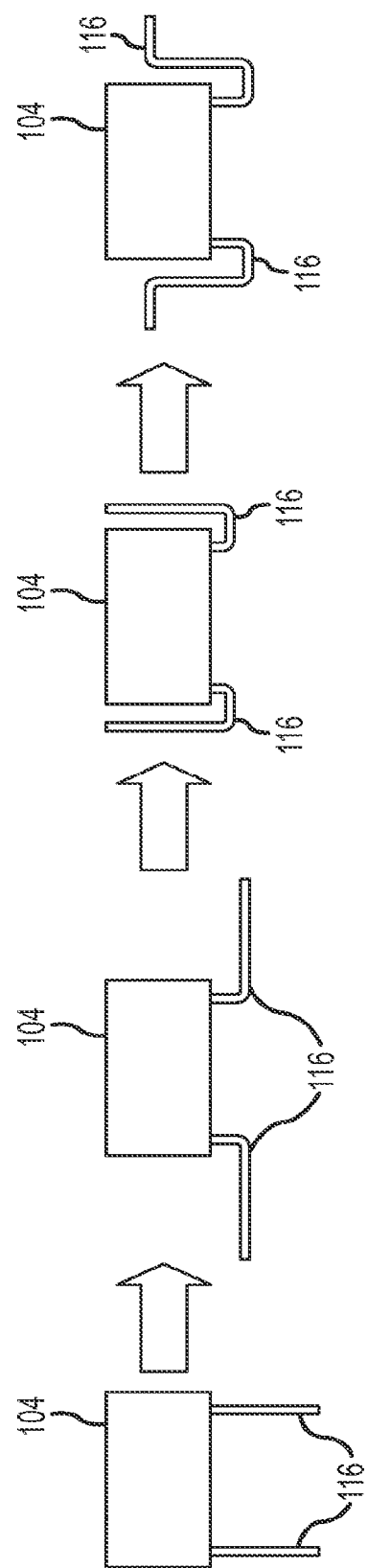
FIG. 7 depicts a second process for manufacturing a segmented display in accordance with embodiments of the present disclosure.

FIGS. 6 and 7 depict another possible configuration of leads 116 and the method for forming the same. Specifically, the leads 116 may be formed for reverse or thru-hole mounting onto a PCB or the like. Even more specifically, the leads 116 may initially point straight away from the package body 104 and then a series of folding or bending steps may be performed to achieve a lead configuration that enables the segmented display 100 to be mounted on the reverse side of a PCB or the like.

Figure 8:
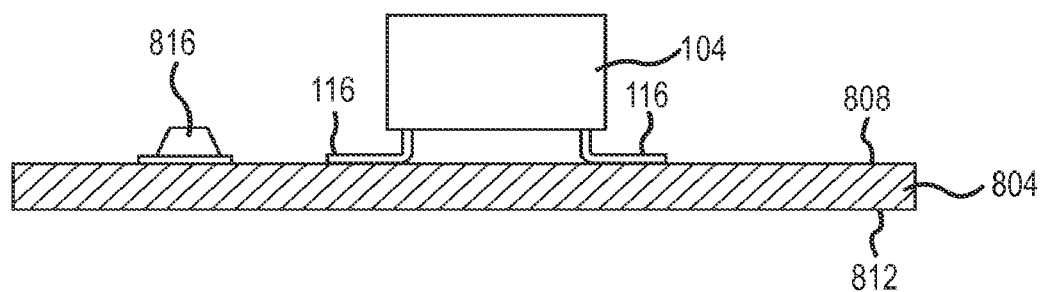
FIG. 8 is a cross-sectional view of a segmented display mounted in a first arrangement in accordance with embodiments of the present disclosure.
Figure 9:
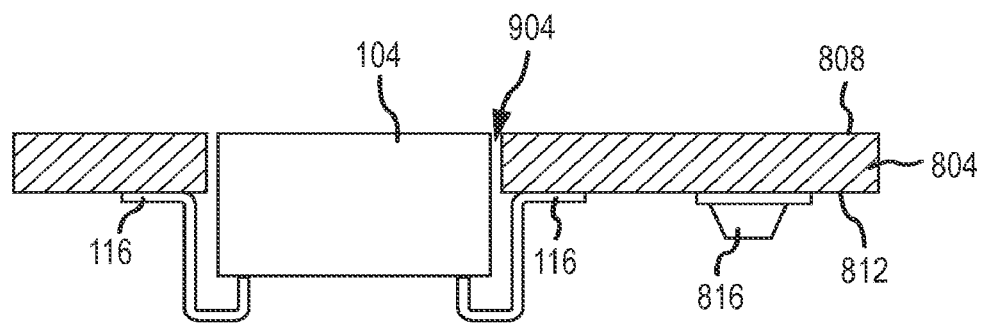
FIG. 9 is a cross-sectional view of a segmented display mounted in a second arrangement in accordance with embodiments of the present disclosure.

FIGS. 8 and 9 depict example applications in which the segmented display 100 can be utilized. FIG. 8 shows an embodiment which includes a substrate 804 having a top surface 808 and an opposing bottom surface 812. The substrate 804, in some embodiments, may correspond to a PCB or the like that has other surface mount components 816 attached thereto. In some embodiments, the substrate 804 may be constructed of any type of flexible, rigid, or semi-rigid material. More specifically, the substrate 804 may comprise a thermosetting industrial laminate including a continuous filament glass cloth material with an epoxy resin binder. For example, the substrate 804 may comprise composites that are manufactured in accordance with the FR-4 and/or G-10 specification. As another example, the substrate 804 may correspond to a flexible or rigid PCB.

Although FIG. 8 only shows the other surface mount components 816 attached to the top surface 808, it should be appreciated that the other surface mount components 816 may also be attached to the opposing bottom surface 812 of the substrate 804.

The top surface 808 of the substrate 804 may correspond to a surface of the substrate 804 that is exposed to or directed toward a user that is viewing the display 100. In some embodiments, the segmented display 100 can be mounted to the top surface 808 of the substrate 804 using the L-shaped leads and known SMT reflow techniques.

FIG. 9 shows that the segmented display 100 can be mounted within a hole or via 904 of the substrate 804. Specifically, this enables the top surface 108 of the package body 104 to be moved closer or in the same plane with the top surface 808 of the substrate 804. The reverse mounting of the segmented display 100 may help create a virtually flat plane with the top surface 808 of the substrate 804, thereby allowing the display 100 to be fitted into applications with tight top spacing requirements. As seen in FIG. 9, the other surface mount components 816 may be mounted on the opposing bottom surface 812 of the substrate 804 along with the segmented display 100. It should be appreciated that combinations of the configurations depicted in FIGS. 8 and 9 may also be implemented without departing from the scope of the present disclosure.

Figure 10:
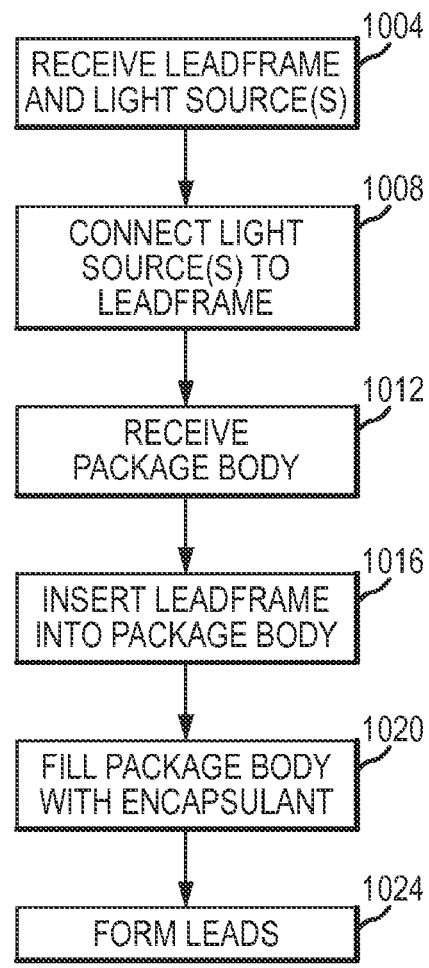
FIG. 10 is a flow chart depicting a method of manufacturing a segmented display in accordance with embodiments of the present disclosure.

With reference now to FIG. 10, a method of manufacturing a segmented display 100 or multiple segmented displays will be described in accordance with embodiments of the present disclosure. More specifically, although the method will be primarily described in connection with manufacturing a single segmented display 100, it should be appreciated that batch-manufacturing techniques can be employed to simultaneously produce a plurality of similar segmented displays. The batch-manufacturing techniques may comprise an optional manufacturing step where each of the segmented displays 100 are prepared with a common leadframe until forming of the leads is required at which point the displays are singulated.

The process begins when a leadframe 204 is received along with one or more light sources 412 (step 1004). The light source(s) 412 may be initially mounted on the leadframe 204 or they may be received separately and subsequently mounted on the leadframe 204. As noted above, the light source(s) 412 may be mounted on a top surface of the leadframe 204 or within a leadframe socket 436.

The method continues by electrically connecting the light source(s) 412 to the leadframe 204 (step 1008). In some embodiments, this step may be partially accomplished by simply mounting the light source(s) 412 to the leadframe 204. This step, however, may also comprise the process of connecting one or more wires to the light source(s) 412 and the leadframe 204.

The process continues by receiving the package body 104 (step 1012). As can be appreciated, this step may occur before, after, or simultaneous with step 1004 and/or 1008. The leadframe 204 may then be inserted into the cavity of the package body 104 so that the light source(s) 412 are substantially proximate to the opposing inner surface 402 of the package body 104 (step 1016). Furthermore, this step may occur before, after, or simultaneous with step 1004 and/or 1008. In other words, the light source(s) 412 mounting and/or electrical connection to the leadframe 204 may occur after the leadframe 204 is inserted into the package body 104.

Thereafter, the cavity of the package body 104 may be filled with the encapsulant 228 (step 1020). In some embodiments, this step may also require a curing process to harden or cure the encapsulant 228 within the package body 104. Once the encapsulant 228 is cured, the method may terminate with the forming of the leads 116 as shown in either FIG. 5 or FIG. 7 (step 1024).

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A segmented display, comprising:
   a package body including one or more vias and a cavity established by one or more sidewalls;
   a leadframe configured to support electronics on a top major surface thereof, the leadframe also being configured to be at least partially inserted into the cavity of the package body such that the top major surface of the leadframe places the electronics in proximity but external to at least one of the one or more vias of the package body; and
   an encapsulant configured to fill the cavity and substantially fix the leadframe relative to the package body.

2. The display of claim 1, wherein the one or more vias extend between a top surface of the package body and an opposing inner surface of the package body and wherein the top major surface of the leadframe is substantially adjacent to the opposing inner surface of the package body.

3. The display of claim 2, wherein the electronics are contained within the at least one of the one or more vias such that the electronics are positioned between the top surface of the package body and the opposing inner surface of the package body and wherein the electronics include at least one light source and at least one wire connecting the light source to the leadframe.

4. The display of claim 1, wherein the encapsulant also fills the one or more vias.

5. The display of claim 4, wherein the encapsulant comprises at least one of epoxy, silicone, a hybrid of silicone and epoxy, phosphor, a hybrid of phosphor and silicone, an amorphous polyamide resin or fluorocarbon, glass, and plastic.

6. The display of claim 4, further comprising an additional encapsulant that is provided over at least some of the electronics.

7. The display of claim 6, wherein the additional encapsulant comprises phosphor, wherein the encapsulant comprises a material other than phosphor, and wherein the additional encapsulant is in direct contact with the encapsulant.

8. The display of claim 1, wherein the electronics include at least one light source and wherein light generated by the light source travels directly from a light-emitting surface of the light source to the encapsulant.

9. The display of claim 1, wherein the leadframe comprises one or more leads that protrude from the encapsulant.

10. The display of claim 9, wherein each of the one or more leads are configured to enable surface mounting of the display to a substrate.

11. The display of claim 10, wherein each of the one or more leads are configured to enable reverse surface mounting of the display to the substrate.

12. The display of claim 1, wherein the package body comprises a polymer.

13. A multi-segment display, comprising:
    a first segment established in a package body, the first segment including a first via that extends between a top surface of the package body and an opposing inner surface of the package body;
    a second segment established in the package body, the second segment including a second via that extends between the top surface of the package body and the opposing inner surface of the package body;
    a first light source positioned in proximity but external to the first via;
    a second light source positioned in proximity to the second via; and
    an encapsulant that at least partially fills the first and second vias as well as at least a portion of a cavity established by sidewalls of the package body.

14. The multi-segment display of claim 13, further comprising a leadframe that is received by the cavity of the package body.

15. The multi-segment display of claim 14, wherein a top major surface of the leadframe supports the first and second light sources and wherein the top major surface of the leadframe abuts the opposing inner surface of the package body.

16. The multi-segment display of claim 15, wherein the first light source is positioned within the first via and wherein the second light source is positioned within the second via.

17. The multi-segment display of claim 15, wherein the leadframe comprises a socket that receives the first light source.

18. The multi-segment display of claim 14, wherein the encapsulant substantially fixes the leadframe within the cavity of the package body.

19. A method, comprising:
    emitting light from a first light source that is mounted on a leadframe and external to a via, wherein the light emitted by the first light source travels directly to an encapsulant contained within the via which forms a first segment of a multi-segmented display, and wherein the encapsulant also encapsulates the leadframe within a package body of the multi-segmented display; and
    emitting light from a second light source that is mounted on the leadframe, wherein the light emitted by the second light source travels directly to the encapsulant that is also contained within a second segment of the multi-segmented display.

20. The method of claim 19, wherein the first light source comprises a first LED, wherein the second light source comprises a second LED, and wherein the encapsulant comprises at least one of epoxy, silicone, a hybrid of silicone and epoxy, phosphor, a hybrid of phosphor and silicone, an amorphous polyamide resin or fluorocarbon, glass, and plastic.

* * * * *